United States Patent
Kato (10) Patent No.: US 9,320,161 B2
(45) Date of Patent: Apr. 19, 2016

(54) ON-VEHICLE ELECTRONIC DEVICE

(71) Applicant: Alpine Electronics, Inc., Tokyo (JP)

(72) Inventor: Kazunari Kato, Fukushima (JP)

(73) Assignee: Alpine Electronics, Inc., Tokyo (JP)

( * ) Notice: Subject to any disclaimer, the term of this patent is extended or adjusted under 35 U.S.C. 154(b) by 297 days.

(21) Appl. No.: 13/950,030

(22) Filed: Jul. 24, 2013

(65) Prior Publication Data

US 2014/0085787 A1   Mar. 27, 2014

(30) Foreign Application Priority Data

Sep. 27, 2012 (JP) ................................. 2012-214316

(51) Int. Cl.
| | |
|---|---|
| *G06F 1/16* | (2006.01) |
| *H05K 5/02* | (2006.01) |
| *H05K 5/00* | (2006.01) |
| *F16H 21/22* | (2006.01) |
| *B60R 11/02* | (2006.01) |
| *B60R 11/00* | (2006.01) |

(52) U.S. Cl.
CPC .......... *H05K 5/0217* (2013.01); *B60R 11/0235* (2013.01); *F16H 21/22* (2013.01); *H05K 5/0017* (2013.01); *B60K 2350/405* (2013.01); *B60R 2011/0084* (2013.01); *B60R 2011/0092* (2013.01); *Y10T 74/18216* (2015.01)

(58) Field of Classification Search
CPC ................ G06F 1/1632; G06F 1/1601; G06F 2200/1631; G06F 1/1615; G06F 1/1616; G06F 1/1622; G06F 1/1652; G06F 1/1656; G06F 1/1662; H05K 5/0217; H05K 5/0017; F16H 21/22; Y10T 74/18216; B60R 11/0235; B60R 2011/0084; B60R 2011/0092; B60K 2350/405
USPC ........................ 361/55–679.58; 248/917–924
See application file for complete search history.

(56) References Cited

U.S. PATENT DOCUMENTS

| | | | |
|---|---|---|---|
| 4,745,823 A | 5/1988 | Morita et al. | |
| 5,362,144 A | * 11/1994 | Shioya | ................... B60K 37/02 312/223.1 |

FOREIGN PATENT DOCUMENTS

JP          10-333595          12/1998

* cited by examiner

*Primary Examiner* — Anthony Haughton
*Assistant Examiner* — Ingrid Wright
(74) *Attorney, Agent, or Firm* — Brinks Gilson & Lione (57) ABSTRACT

A first drive arm and a second drive arm are rotatably coupled. A tip portion of the first drive arm and a device main body are connected to each other through a first connection link, and a tip portion of a second drive arm and the device main body are connected to each other through a second connection link. Because each of the drive arms and the device main body are connected to each other through an axial rotational portion, the device main body is moves smoothly between an extended position and a retracted position, and vibration and rattling are suppressed.

18 Claims, 4 Drawing Sheets

ON-VEHICLE ELECTRONIC DEVICE

PRIORITY CLAIM

This application claims the benefit of Japanese Patent Application No. 2012-214316, filed on Sep. 27, 2012, and which is incorporated by reference herein in its entirety.

BACKGROUND

1. Field of the Invention

The present invention relates to an on-vehicle electronic device that has a device main body provided with a display panel or the like. The device main body is moved so as to change its position between a retracted position and a projected position. The present invention particularly relates to the on-vehicle electronic device, in which rattling that occurs when the device main body is operated, can be suppressed.

2. Description of the Related Art

Examples of electronic devices provided in a vehicle cabin of an automobile include a device that has a device main body provided with a display panel or the like. The device main body is moved so as to change its position from a retracted position, in which the device main body is retracted in a dash board or an instrument panel, to a projected or operative projection position, in which the device main body is exposed to the outside of the dash board or the instrument panel.

A display device described in Japanese Unexamined Patent Application Publication No. 10-333595 includes a liquid crystal display (LCD) monitor unit that is supported such that the LCD monitor unit can be projected from the inside of a casing. Japanese Unexamined Patent Application Publication No. 10-333595 discloses a slide mechanism that supports the LCD monitor unit such that the LCD monitor unit can be projected. The slide mechanism has a plurality of sleeve-shaped members superposed with one another and a pair of link arms.

SUMMARY

As described in Japanese Unexamined Patent Application Publication No. 10-333595, in a structure in which the plurality of sleeve-shaped members are superposed with one another so as to support and move the LCD unit, the sleeve-shaped members need thicknesses. Thus, it is difficult to reduce the thickness and the size of the entire device. Furthermore, since portions where the sleeve-shaped members are combined with one another tend to rattle, vibration of the vehicle is likely to cause rattling of the LCD monitor unit, and accordingly, noise is easily generated.

Next, in a structure that has a pair of link arms combined with each other, slotted holes are formed in a bottom plate and a rear surface portion of the casing, into which pins provided on both end portions of link arms are slidably inserted. In this structure, the pins and the slotted holes tend to rattle. Thus, vibration of the vehicle is likely to cause rattling of the LCD monitor unit, and accordingly, noise is easily generated. Furthermore, the movement of the LCD monitor unit is not smooth. Thus, smooth operations cannot be realized.

The present invention solves the known problems and provides an on-vehicle electronic device, in which a device main body can be smoothly moved so as to change its position from a retracted position to a projected position, and portions that cause rattling are reduced so as to reduce vibration noise during operation.

An on-vehicle electronic device according to the present invention includes at least one guide unit, a device main body that reciprocates along the guide unit, and a drive mechanism that causes the device main body to reciprocate. The drive mechanism includes at least one drive arm that has a base portion supported such that the drive arm is rotatable about at least one support shaft, a rotation driver that rotates the drive arm, and at least one connection link that connects a tip portion of the drive arm and the device main body. In the on-vehicle electronic device, the connection link and the drive arm are connected to each other such that the connection link and the drive arm are rotatable relative to each other about an arm-side connection shaft, and the connection link and the device main body are connected to each other such that the connection link and the device main body are rotatable relative to each other about a main body-side connection shaft.

In the on-vehicle electronic device according to the present invention, the rotational force of the drive arm is converted into the reciprocating force of the device main body. The tip portion of the drive arm and the device main body are connected to each other through the connection link. The connection link and the drive arm are connected to each other through the connection shaft such that the connection link and the drive arm are rotatable relative to each other, and the connection link and the device main body are connected to each other through the connection shaft such that the connection link and the device main body are rotatable relative to each other. Thus, a connection portion, which uses a shaft and a slotted hole sliding against each other, is no longer necessary between the tip portion of the drive arm and the device main body, and accordingly, rattling of the connection portion where the drive arm and the device main body are connected to each other can be suppressed.

Furthermore, since the rotational force of the drive arm is transmitted to the device main body through the connection link, when the drive arm is rotated, the device main body can smoothly reciprocates.

In the connection portion where the connection link and the device main body are connected to each other, the connection link and the device main body may be directly connected to each other through the main body-side connection shaft such that the connection link and the device main body are rotatable relative to each other. Alternatively, a different member such as a bracket, which is secured to the main body, and the connection link may be connected to each other through the main body-side connection shaft such that the different member and the connection link are rotatable relative to each other.

The device main body preferably reciprocates in a linear path along the guide unit. The support shaft, the arm-side connection shaft, and the main body-side connection shaft are preferably parallel to one another. Furthermore, the axes of the support shaft, the arm-side connection shaft, and the main body-side connection shaft preferably extend in a direction perpendicular to a movement direction of the device main body.

When the device main body is positioned at one or either of one and the other movement end points, the arm-side connection shaft and the main body-side connection shaft are preferably aligned along a movement direction of the device main body.

With the above-described structure, when the device main body is started to move from the movement end point and when the device main body being moved is reaching the movement end point, a component of force that attempt to rotate the connection link is reduced. Thus, the rotational force of the drive arm is effectively transmitted to the device main body. Accordingly, the device main body can be smoothly started from the movement end point and smoothly moved toward the movement end point.

When an arm center line that connects the axes of the support shaft and the arm-side connection shaft to each other is in a direction perpendicular to the movement direction of the device main body, the axis of the arm-side connection shaft is preferably moved to a position further away from the support shaft than the axis of the main body-side connection shaft is.

The at least one guide unit preferably includes a pair of first and second guide units, at least one of the first guide unit and the second guide unit is preferably a guide shaft, and the guide shaft is preferably slidably inserted through a thrust bearing secured to the device main body.

With the above-described structure, the device main body can be smoothly moved along the guide shaft, and accordingly, the occurrence of rattling of the device main body due to vibration of a vehicle body is suppressed.

The at least one drive arm preferably includes a pair of first and second drive arms, the at least one connection link preferably includes a pair of first and second connection links, and the at least one support shaft preferably includes a pair of first and second support shafts. In a first drive link, the first support shaft is preferably positioned on the first guide unit side and the first connection link is preferably positioned on the second guide unit side. In a second drive link, the second support shaft is preferably positioned on the second guide unit side and the second connection link is preferably positioned on the first guide unit side.

The first and second drive arms are preferably positioned on one side and the other side of a movement region of the device main body.

With the above-described structure, a movement force applied from the first drive arm and a movement force applied from the second drive arm act on both the sides of the device main body. Thus, the movement forces are applied to the device main body in a balanced manner, and accordingly, the device main body can be smoothly moved.

In the on-vehicle electronic device according to the present invention, the device main body provided with a display panel or the like can be smoothly moved, and the occurrence of rattling due to vibration of the vehicle body can be suppressed.

DETAILED DESCRIPTION

An on-vehicle electronic device 1 illustrated in FIGS. 1 to 4 is installed in a dash board 2 positioned on the interior side of a windshield of an automobile. The dash board 2 has an elongated opening portion 3 that opens upward.

Figure 2:
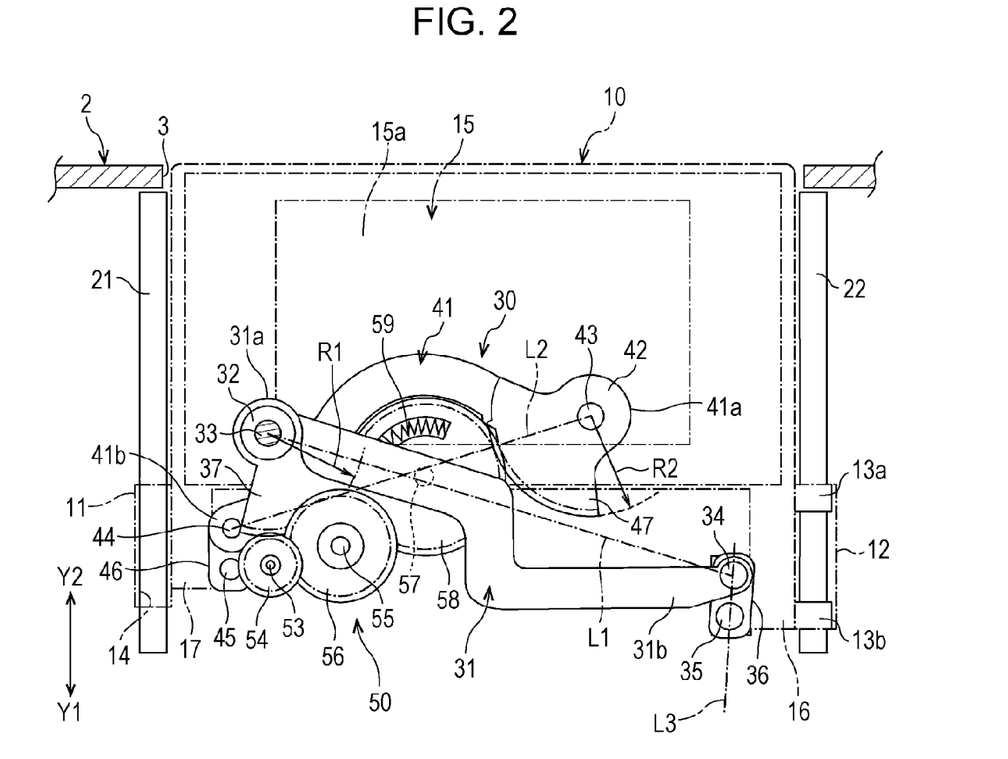
FIG. 2 is a front view of a main body of the device in a retracted position.
Figure 4:
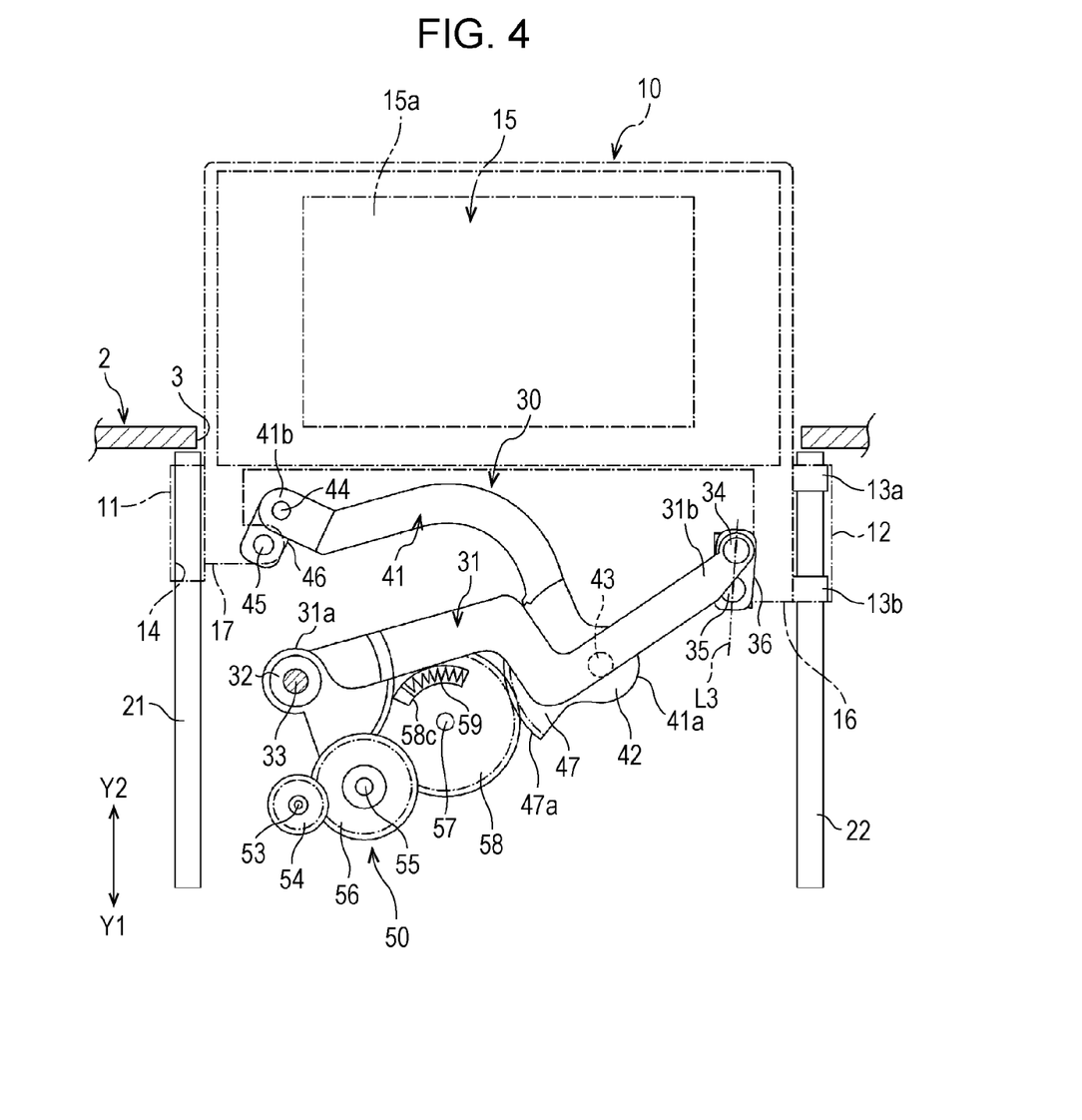
FIG. 4 is a front view of the display device shown in an operative projection position.

A device main body 10 is moved so as to change its position between a retracted position as illustrated in FIG. 2 and a projected position as illustrated in FIG. 4. In the retracted position, the device main body 10 is retracted in the dash board 2. In the projected position, the device main body 10 is projected toward the upper side of the dash board 2.

The device main body 10 includes a display panel 15 disposed therein. The display panel 15 uses a color liquid crystal display panel or an organic electroluminescence display panel. A display screen 15a of the display panel 15 faces the inside of the vehicle (X1 direction). The X1 direction indicates a direction that faces an intermediate position between a driver seat and a passenger seat in the automobile.

A first guide shaft 21 that serves as a first guide unit and a second guide shaft 22 that serves as a second guide unit are provided in the dash board 2. The first guide shaft 21 and the second guide shaft 22 are each formed of metal and each have a circular section. The first guide shaft 21 and the second guide shaft 22 are parallel to each other and extend in the Y1-Y2 direction, which is the movement direction of the device main body 10. The Y1-Y2 direction extends substantially in the vertical direction.

A first bearing portion 11 and a second bearing portion 12 are integrally formed with the device main body 10 in a lower left portion and a lower right portion of the device main body 10, respectively. The first bearing portion 11 and the second bearing portion 12 are formed of synthetic resin together with a main body portion of the device main body 10.

As illustrated in, for example, FIG. 2, a thrust bearing 13a and a thrust bearing 13b are respectively held in and secured to the inside of an upper end portion and a lower end portion of the second bearing portion 12. The thrust bearings 13a and 13b are metal oilless bearings. The second guide shaft 22 is slidably inserted through the thrust bearings 13a and 13b such that substantially no gap is formed between an outer circumference of the second guide shaft 22 and the thrust bearings 13a and 13b and the thrust bearings 13a and 13b are subjected to minimum frictional resistance.

The first bearing portion 11 has a bearing hole 14 formed therein. An inner diameter of the bearing hole 14 is substantially the same as or slightly larger than a diameter of the first guide shaft 21. The first guide shaft 21 is inserted through the bearing hole 14 such that an outer circumstantial portion of the first guide shaft 21 is slidable through the bearing hole 14.

The device main body 10 is movable in the Y1-Y2 direction with reference to a sliding portion where the second guide shaft 22 slides through the two thrust bearings 13a and 13b. Since the thrust bearings 13a and 13b allow the second guide shaft 22 to slide therethrough and the bearing hole 14 of the first bearing portion 11 allows the first guide shaft 21 to slide therethrough with minimum gaps formed therebetween, the device main body 10 can smoothly move without rattling.

Figure 1:
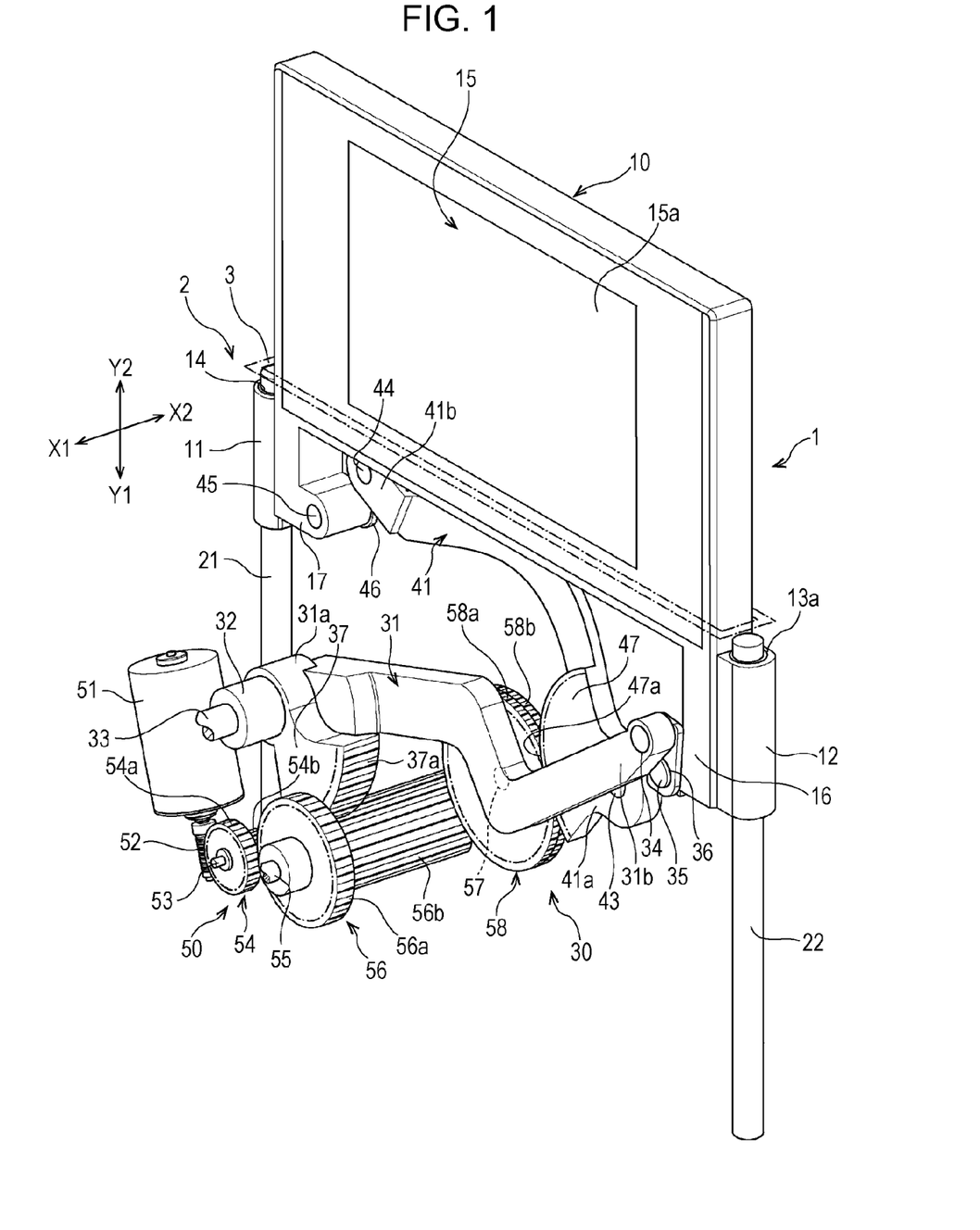
FIG. 1 is a perspective view of an on-vehicle display device according to an embodiment of the present invention.

A first drive arm 31 and a second drive arm 41 are provided in the dash board 2. As illustrated in FIG. 1, the first drive arm 31 is positioned on the inner side (X1 side) relative to a movement region of the device main body 10 and the second drive arm 41 is positioned on the outer side (X2 side) relative to the movement region of the device main body 10. The first drive arm 31 and the second drive arm 41 are formed of synthetic resin or a light metal material.

A support plate (not shown), to which a first support shaft 33 is secured, is provided in the dash board 2. The first support shaft 33 is provided at a position close to the first guide shaft 21. A bearing portion 32, which is integrally formed with a base portion 31a of the first drive arm 31, is rotatably supported by the first support shaft 33.

Figure 3:
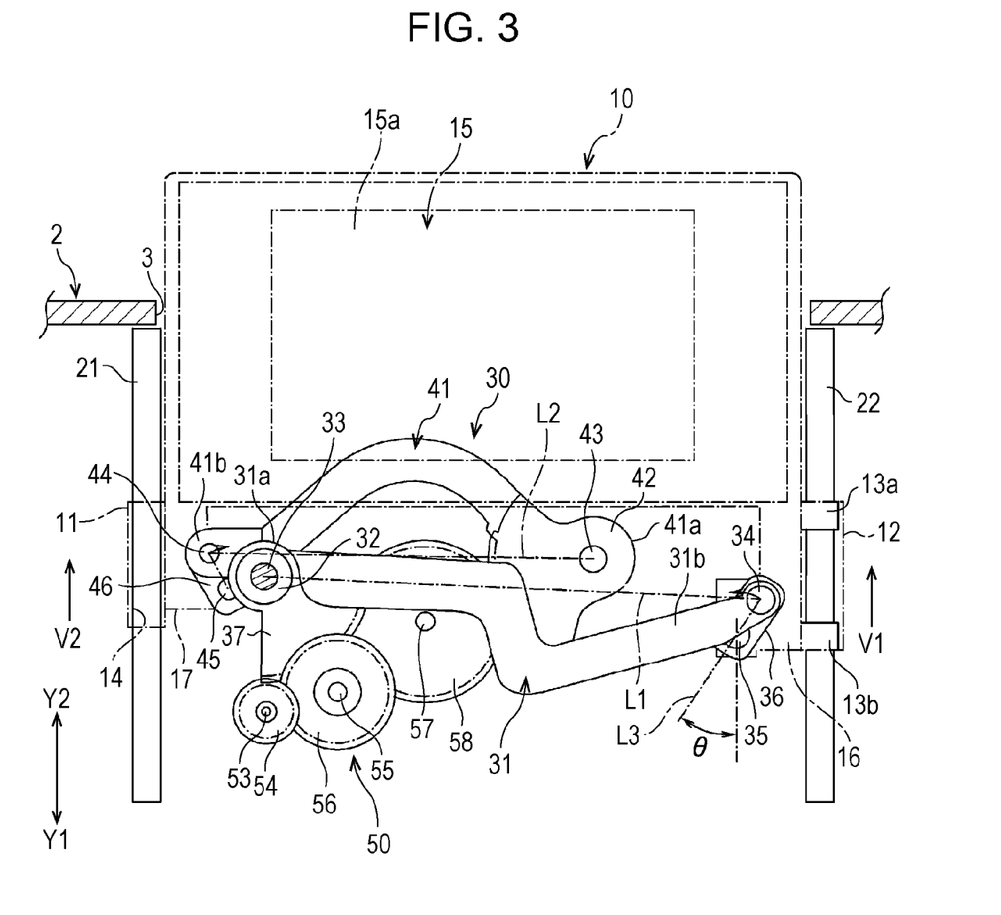
FIG. 3 is a front view of the display device during the movement of the display device.

As illustrated in FIGS. 2 to 4, a tip portion 31b of the first drive arm 31 extends to a position close to the second guide shaft 22. An arm-side connection shaft 34 is secured to the tip portion 31b of the first drive arm 31. A drive support portion 16 is integrally formed with the device main body 10 at a position closer to the center of the device main body 10 in front view than the second bearing portion 12. A main body-side connection shaft 35 is secured to the drive support portion 16.

A first connection link 36 is provided in a drive mechanism 30. The first connection link 36 is formed of a metal plate or a synthetic resin plate. The first connection link 36 and the tip portion 31b of the first drive arm 31 are connected to each other such that the first connection link 36 and the first drive arm 31 are rotatable relative to each other about the axis of the arm-side connection shaft 34. The drive support portion 16 and the first connection link 36 are connected to each other such that the drive support portion 16 and the first connection link 36 are rotatable relative to each other about the axis of the main body-side connection shaft 35.

The axis of the first support shaft 33, the axis of the arm-side connection shaft 34, and the axis of the main body-side connection shaft 35 are parallel to one another and each extend in the front-rear direction (X1-X2 direction). That is, each of these axes extends in a direction perpendicular to a movement direction (Y1-Y2 direction) of the device main body 10.

A second support shaft 43 is secured on the outer side (X2 side) relative to the device main body 10 in the dash board 2. As illustrated in FIGS. 2 to 4, the second support shaft 43 is provided at a position close to the second guide shaft 22. A bearing portion 42, which is integrally formed with a base portion 41a of the second drive arm 41, is rotatably supported by the second support shaft 43.

A tip portion 41b of the second drive arm 41 extends to a position close to the first guide shaft 21. An arm-side connection shaft 44 is secured to the tip portion 41b of the second drive arm 41. A drive support portion 17 is integrally formed with the device main body 10 at a position closer to the center of the device main body 10 in front view than the first bearing portion 11. A main body-side connection shaft 45 is secured to the drive support portion 17.

A second connection link 46 is formed of a metal plate or a synthetic resin plate. The second connection link 46 and the tip portion 41b of the second drive arm 41 are connected to each other such that the second connection link 46 and the second drive arm 41 are rotatable relative to each other about the axis of the arm-side connection shaft 44. The drive support portion 17 and the second connection link 46 are connected to each other such that the drive support portion 17 and the second connection link 46 are rotatable relative to each other about the axis of the main body-side connection shaft 45.

The axis of the second support shaft 43, the axis of the arm-side connection shaft 44, and the axis of the main body-side connection shaft 45 are parallel to one another and each extend in the front-rear direction (X1-X2 direction). That is, each of these axes extends in a direction perpendicular to the movement direction (Y1-Y2 direction) of the device main body 10.

A rotation driver 50 is provided in the dash board 2. The rotation driver 50 rotates the first drive arm 31 and the second drive arm 41 in a manner in which the first drive arm 31 and the second drive arm 41 are synchronized with each other.

As illustrated in FIG. 1, the rotation driver 50 includes a drive motor 51 provided on the inner side (X1 side) relative to the device main body 10. The drive motor 51 produces large torque at low speed. The rotational speed of the drive motor 51 can be changed by changing power supplied to the drive motor 51. A worm gear 52 is secured to an output shaft of the drive motor 51.

As illustrated in FIG. 1, the rotation driver 50 also includes a gear support shaft 53 secured on the inner side (X1 side) relative to the movement region of the device main body 10. A compound gear 54 is rotatably supported by the gear support shaft 53. The compound gear 54 has an input gear 54a and an output gear 54b, which are integrally formed with each other. The radius of the pitch circle of the input gear 54a is larger than that of the output gear 54b. The worm gear 52 is engaged with the input gear 54a.

A gear support shaft 55 is provided below (on the Y1 side of) the movement region of the device main body 10. A compound gear 56 is rotatably supported by the gear support shaft 55. The compound gear 56 has a reduction gear 56a and a connection gear 56b, which are integrally formed with each other. The reduction gear 56a is engaged with the output gear 54b. The radius of the pitch circle of the reduction gear 56a is larger than that of the output gear 54b. Thus, rotation of the compound gear 54 is transmitted to the compound gear 56 while the rotation speed is reduced.

The connection gear 56b is a spur gear elongated in the front-rear direction (X1-X2 direction). A sector gear 37 is integrally formed with the base portion 31a of the first drive arm 31. A toothed portion 37a of the sector gear 37 is engaged with an inner (X1 side) end portion of the connection gear 56b.

A gear support shaft 57 is secured on the outer side (X2 side) relative to the movement region of the device main body 10 (see FIG. 3). An intermediate gear 58 is rotatably supported by the gear support shaft 57. As illustrated in FIG. 1, the intermediate gear 58 has two separate gears 58a and 58b. The radii of the pitch circles of the separate gears 58a and 58b are the same. The separate gears 58a and 58b are supported such that the separate gears 58a and 58b can be rotated independently of each other. As illustrated in FIG. 4, a compression coil spring 59 is disposed in an opening portion 58c formed in the separate gears 58a and 58b, thereby urging the separate gears 58a and 58b in respective rotational directions opposite to each other. The separate gears 58a and 58b are engaged with an outer (X2 side) end portion of the connection gear 56b. Due to the urging force of the compression coil spring 59, no backlash occurs in an engaged portion where the connection gear 56b and the intermediate gear 58 are engaged with each other.

A sector gear 47 is integrally formed with the base portion 41a of the second drive arm 41. A toothed portion 47a of the sector gear 47 is engaged with the outer (X2 side) end portion of the intermediate gear 58.

Next, operation of the on-vehicle electronic device 1 will be described.

As illustrated in FIG. 2, when the device main body 10 is not used, the first drive arm 31 is rotated clockwise, and the first connection link 36 causes the right-side main body-side connection shaft 35 to move downward (in Y1 direction). Also, the second drive arm 41 is rotated counterclockwise, and the second connection link 46 causes the left-side main body-side connection shaft 45 to move downward (in Y1 direction).

As a result, the device main body 10 is moved downward while being guided by the first guide shaft 21 and the second guide shaft 22 and assumes the retracted position in which the device main body 10 is retracted in the dash board 2.

When the device main body 10 is used, an operation of an operation device (not shown) by the user or turning on of an ignition switch of the automobile causes the drive motor 51 to start. The rotational force of the drive motor 51 is transmitted from the worm gear 52 to the compound gears 54 and 56. The rotational force of the connection gear 56b of the compound gear 56 is transmitted to the sector gear 37, thereby rotating the first drive arm 31 counterclockwise. At the same time, the rotational force of the connection gear 56b is transmitted to the sector gear 47 via the intermediate gear 58, thereby rotating the second drive arm 41 clockwise.

As sequentially illustrated in FIGS. 2, 3, and 4, when the first drive arm 31 is rotated counterclockwise, the rotational force of the arm-side connection shaft 34 of the tip portion 31b is applied to the main body-side connection shaft 35 through the first connection link 36, thereby moving up the right-side drive support portion 16 of the device main body 10. At the same time, the clockwise rotational force of the second drive arm 41 is applied from the arm-side connection shaft 44 to the main body-side connection shaft 45 through the second connection link 46, thereby moving up the left-side drive support portion 17 of the device main body 10.

As a result, the device main body 10 is moved in the Y2 direction while being guided by the first guide shaft 21 and the second guide shaft 22. As illustrated in FIG. 4, the device main body 10 passes through the opening portion 3, is moved toward the upper side of the dash board 2, and is stopped. As illustrated in FIG. 4, when the device main body 10 is stopped in the projected position, the display screen 15a of the display panel 15 is visible to an occupant seated in the driver seat or the passenger seat.

As illustrated in FIG. 2, when the device main body 10 is stopped at an end of movement on the Y1 side and assumes the retracted position, the axis of the arm-side connection shaft 34 provided in the tip portion 31b of the first drive arm 31 is positioned substantially directly above the axis of the main body-side connection shaft 35, and the axis of the arm-side connection shaft 34 and the axis of the main body-side connection shaft 35 are aligned along the Y1-Y2 direction, which is the movement direction of the device main body 10. That is, a link center line L3, which connects the axis of the arm-side connection shaft 34 of the first connection link 36 and the axis of the main body-side connection shaft 35 of the first connection link 36 to each other, is substantially parallel to the Y1-Y2 direction. The term "parallel" herein refers to a state where up to ±10-degree deviation, preferably up to ±5-degree deviation, may exist compared to a strict parallel state in a geometrical sense.

Likewise, the axis of the arm-side connection shaft 44 provided in the tip portion 41b of the second drive arm 41 is positioned substantially directly above the axis of the left-side main body-side connection shaft 45, and the axis of the arm-side connection shaft 44 and the axis of the main body-side connection shaft 45 are aligned along the Y1-Y2 direction, which is the movement direction of the device main body 10.

Thus, when the first drive arm 31 and the second drive arm 41 are started to rotate from a state illustrated in FIG. 2, upward (Y2 direction) components of force act on the main body-side connection shafts 35 and 45. Thus, the occurrence of components of force in the left-right direction is suppressed, and accordingly, the device main body 10 in the retracted position is smoothly started to move up. Furthermore, when the structure in the state illustrated in FIG. 2 is subjected to vibration in the up-down direction (Y1-Y2 direction), components of force that attempt to rotate the first connection link 36 and the second connection link 46 are reduced. This suppresses the occurrence of rattling of the device main body 10 and the drive mechanism 30 when the device main body 10 and the drive mechanism 30 are subjected to external vibration.

In FIG. 3, an arm center line L1, which connects the axis of the first support shaft 33 and the axis of the arm-side connection shaft 34 provided in the tip portion 31b of the first drive arm 31 to each other, is substantially in a horizontal position. Also, an arm center line L2, which connects the axis of the second support shaft 43 and the axis of the arm-side connection shaft 44 of the tip portion 41b of the second drive arm 41 to each other, is substantially in a horizontal position.

At this time, the axis of the arm-side connection shaft 34 is further away from the first support shaft 33 than the axis of the main body-side connection shaft 35 is. By setting the lengths of the arm center line L1 and the first connection link 36 so as to establish such a positional relationship, the device main body 10 can be moved so as to change its position from the retracted position illustrated in FIG. 2 to the projected position illustrated in FIG. 4 due to the counterclockwise rotational force of the first drive arm 31.

Referring to FIG. 3, an inclination angle θ represents the maximum inclination of the link center line L3, which connects the axis of the arm-side connection shaft 34 of the first connection link 36 and the axis of the main body-side connection shaft 35 of the first connection link 36, relative to the Y1-Y2 direction, which is the movement direction of the device main body 10. The inclination angle θ is set to equal to or smaller than 45-degree, and preferably set to equal to or smaller than 40-degree.

By limiting the inclination angle θ, at which the first connection link 36 is inclined when the first drive arm 31 is rotated, within the above-described range, the ratio of the component of the drive force in the Y1-Y2 direction applied to the main body-side connection shaft 35 by the rotational force of the first drive arm 31 is increased. That is, the amount of rotation of the first connection link 36 when the first drive arm 31 is rotated is reduced. This can reduce the ratio of the rotational force of the first drive arm 31 used for producing the rotational force of the first connection link 36. As a result, the device main body 10 can be smoothly moved in the Y1-Y2 direction, and accordingly, rattling caused by rotation of the first connection link 36 can be suppressed.

Furthermore, as illustrated in FIG. 3, when the second drive arm 41 is rotated, operation of the second connection link 46 and the positional relationship between the arm-side connection shaft 44 and the main body-side connection shaft 45 are similar to operation of the first connection link 36 and the positional relationship between the arm-side connection shaft 34 and the main body-side connection shaft 35, respectively.

As illustrated in FIG. 4, when the device main body 10 has been moved to the end of movement on the Y2 side and assumes the projected position, the axis of the arm-side connection shaft 34 provided in the first drive arm 31 is positioned substantially directly above the axis of the main body-side connection shaft 35, the axis of the arm-side connection shaft 34 and the axis of the main body-side connection shaft 35 are aligned along the Y1-Y2 direction, which is the movement direction of the device main body 10, and the link center line L3 is substantially parallel to the Y1-Y2 direction. Also, the axis of the arm-side connection shaft 44 provided in the second drive arm 41 is positioned above the axis of the main body-side connection shaft 45.

Thus, when the device main body 10 is moved so as to assume the projected position illustrated in FIG. 4, or, moved downward so as to change its position from the projected position to the retracted position, the movement force in the Y1-Y2 direction is effectively transmitted from the first drive arm 31 and the second drive arm 41 to the device main body 10. This allows the device main body 10 to be smoothly moved. Furthermore, also when the structure in the state illustrated in FIG. 4 is subjected to vibration in the up-down direction (Y1-Y2 direction), components of force that attempt to rotate the first connection link 36 and the second connection link 46 are reduced. This suppresses the occurrence of rattling of the device main body 10 and the drive mechanism 30.

In the drive mechanism 30, due to rotations of the first connection link 36 and the second connection link 46, rotational motions of the first drive arm 31 and the second drive arm 41 are converted into a linear motion of the device main body 10 in the Y1-Y2 direction. Since all the operations of connection portions where the first drive arm 31 and the second drive arm 41 are connected to the device main body 10 are rotational motions about the axes, the device main body 10 can be smoothly moved, and accordingly, rattling of a power transmission unit can be suppressed.

In particular, unlike the related art, there is no slide mechanism using a slotted hole and a shaft. Thus, the device main body 10 is significantly smoothly moved, and vibration noise of the drive mechanism 30 generated by rattling of a slotted hole and a shaft is suppressed.

The drive motor 51 produces large torque at low rotational speed, and the rotational speed of the drive motor 51 can be controlled. Thus, by controlling the rotational speed of the drive motor 51, a movement speed at which the device main body 10 is moved so as to change its position from the retracted position illustrated in FIG. 2 to the projected position illustrated in FIG. 4 can be smoothly changed. By doing this, improved movement state can be maintained.

As illustrated in FIG. 1, the first drive arm 31 and the first connection link 36 are positioned on the inner side (X1 side) relative to the movement region of the device main body 10 and the second drive arm 41 and the second connection link 46 are positioned on the outer side (X2 side) relative to the movement region of the device main body 10. On both sides of the movement region of the device main body 10 and on both sides of guiding portions of the first guide shaft 21 and the second guide shaft 22, the movement forces are applied to the device main body 10 from the first connection link 36 and the second connection link 46. Thus, application of a moment that attempts to turn the device main body 10 in the X1-X2 direction is suppressed while the device main body 10 is being moved. This allows the device main body 10 to be more smoothly moved.

As illustrated in FIG. 2, in the drive mechanism 30, the distance between the axes of the first support shaft 33 and the arm-side connection shaft 34, that is, the length of the arm center line L1 of the first drive arm 31 is different from the distance between the axes of the second support shaft 43 and the arm-side connection shaft 44, that is, the length of the arm center line L2 of the second drive arm 41. The length of the arm center line L1 is longer than that of the arm center line L2. Furthermore, a radius R1 of the pitch circle of the sector gear 37 formed in the first drive arm 31 is different from a radius R2 of the pitch circle of the sector gear 47 formed in the second drive arm 41. The radius R1 is larger than the radius R2.

By adjusting the ratio of the lengths of the arm center lines L1 and L2 and the ratio of the lengths of the radii R1 and R2 of the pitch circles, during the movement of the device main body 10 as illustrated in FIG. 3, a velocity component V1 in the Y1-Y2 direction acting on the right-side drive support portion 16 and a velocity component V2 in the Y1-Y2 direction acting on the left-side drive support portion 17 can be set to the same velocity.

Alternatively, by adjusting the ratio of the lengths of the arm center lines L1 and L2 and the ratio of the lengths of the radii R1 and R2 of the pitch circles, the right-side velocity component V1 can be set to a value slightly different from the left-side velocity component V2. In this case, a movement urging force toward the left or right in FIG. 3 can be applied to the device main body 10, and accordingly, rattling of the first and second guide shafts 21 and 22 and the first and second bearing portions 11 and 12 can be completely eliminated.

The present invention is not limited to the above-described embodiment. The following changes for the present invention are possible.

A movement of the device main body 10 in a more balanced manner in the left-right direction can be realized by setting the length of the arm center line L1 to a length the same as the length of the arm center line L2 and setting the radius R1 of the pitch circle to a radius that is the same as the radius R2 of the pitch circle.

Alternatively, the device main body may be moved by a single drive arm instead of providing a pair of drive arms.

Furthermore, the movement direction of the device main body 10 is not limited to the direction of gravity (up-down direction). The device main body 10 may be moved in a direction inclined relative to the direction of gravity or in the horizontal direction. The device main body 10 is not necessarily provided with the display panel. The device main body 10 may be a media drive device provided with a various media or an operation device.

Although preferred embodiments have been described in detail, the present invention is not limited to these specific embodiments of the present invention. Rather, various modifications and changes can be made without departing from the scope of the present invention as described in the accompanying claims. Accordingly, all such modifications are intended to be included within the scope of this invention as defined in the following claims.

What is claimed is:

1. An on-vehicle electronic device comprising:
a guide unit;
a device main body configured to reciprocally move along the guide unit between a retracted position and an extended position; and
a drive mechanism configured to move the device main body between the retracted position and the extended position;
wherein the drive mechanism includes:
at least one drive arm that has a base portion supported such that the drive arm is rotatable about a support shaft;
a rotation driver that rotates the drive arm about the support shaft; and
at least one connection link that connects a tip portion of the drive arm and the device main body;
wherein the connection link and the drive arm are connected to each other such that the connection link and the drive arm are rotatable relative to each other about an arm-side connection shaft; and
wherein the connection link and the device main body are connected to each other such that the connection link and the device main body are rotatable relative to each other about a main body-side connection shaft.

2. The on-vehicle electronic device according to claim 1, wherein the device main body is configured to reciprocally move between the retracted position and the extended position along a linear path;
wherein the support shaft, the arm-side connection shaft, and the main body-side connection shaft are parallel to each other; and
wherein the axes of the support shaft, the arm-side connection shaft, and the main body-side connection shaft extend in a direction perpendicular to a movement direction of the device main body.

3. The on-vehicle electronic device according to claim 1, wherein, when the device main body is positioned at either the retracted position or the extended position, the arm-side connection shaft and the main body-side connection shaft are aligned along a movement direction of the device main body.

4. The on-vehicle electronic device according to claim 3, wherein, when an arm center line that connects the axes of the support shaft and the arm-side connection shaft with each other is oriented in a direction perpendicular to the movement direction of the device main body, the axis of the arm-side connection shaft is moved to a position further away from the support shaft than the axis of the main body-side connection shaft.

5. The on-vehicle electronic device according to claim 1, wherein the guide unit includes a first guide unit and a second guide unit, wherein at least one of the guide units is a guide shaft, and the guide shaft is slidably received through a thrust bearing secured to the device main body.

6. The on-vehicle electronic device according to claim 5, wherein the at least one drive arm includes a first drive arm and a second drive arm, the at least one connection link includes a first connection link and a second connection link, and the at least one support shaft includes a first support shaft and a second support shaft;
wherein, the first support shaft is positioned on the first guide unit side and the first connection link is positioned on the second guide unit side; and
wherein, the second support shaft is positioned on the second guide unit side and the second connection link is positioned on the first guide unit side.

7. The on-vehicle electronic device according to claim 6, wherein the first and second drive arms are respectively positioned on one side and the other side of a movement region of the device main body.

8. The on-vehicle electronic device according to claim 6, wherein the first drive arm and the second drive arm each have a sector gear integrally formed therewith, the sector gears of the first drive arm and the second drive arm are engaged with gears rotated by a single drive motor provided in the rotation driver.

9. The on-vehicle electronic device according to claim 1, wherein when the main body is in the retracted position, the device main body is retracted in an opening formed in a dash board of a vehicle, and when the main body is in the extended position, the main body projects from the opening.

10. A guide unit for moving a display screen, comprising:
the display screen configured to reciprocally move along shafts of the guide unit between a retracted position and an extended position;
a drive mechanism configured to move the display screen between the retracted position and the extended position;
wherein the drive mechanism includes:
at least one drive arm that has a base portion supported such that the drive arm is rotatable about a support shaft;
a rotation driver that rotates the drive arm about the support shaft; and
at least one connection link that connects a tip portion of the drive arm and the display screen;
wherein the connection link and the drive arm are connected to each other such that the connection link and the drive arm are rotatable relative to each other about an arm-side connection shaft; and
wherein the connection link and the display screen are connected to each other such that the connection link and the display screen are rotatable relative to each other about a display screen body-side connection shaft.

11. An on-vehicle electronic device comprising:
a guide unit;
a device main body configured to reciprocally move along the guide unit between a retracted position and an extended position; and
a drive mechanism configured to move the device main body between the retracted position and the extended position;
wherein the drive mechanism includes:
at least one drive arm that has a base portion supported such that the drive arm is rotatable about a support shaft;
a rotation driver that rotates the drive arm about the support shaft; and
at least one connection link that connects a tip portion of the drive arm and the device main body;
wherein the connection link and the drive arm are connected to each other such that the connection link and the drive arm are rotatable relative to each other about an arm-side connection shaft;
wherein the connection link and the device main body are connected to each other such that the connection link and the device main body are rotatable relative to each other about a main body-side connection shaft; and,
wherein the guide unit includes a first guide unit and a second guide unit;
wherein the at least one drive arm includes a first drive arm and a second drive arm, the at least one connection link includes a first connection link and a second connection link, and the at least one support shaft includes a first support shaft and a second support shaft;
wherein, the first support shaft is positioned on the first guide unit side and the first connection link is positioned on the second guide unit side; and
wherein, the second support shaft is positioned on the second guide unit side and the second connection link is positioned on the first guide unit side.

12. The on-vehicle electronic device according to claim 11, wherein the device main body is configured to reciprocally move between the retracted position and the extended position along a linear path;
wherein the support shaft, the arm-side connection shaft, and the main body-side connection shaft are parallel to each other; and
wherein the axes of the support shaft, the arm-side connection shaft, and the main body-side connection shaft extend in a direction perpendicular to a movement direction of the device main body.

13. The on-vehicle electronic device according to claim 11, wherein, when the device main body is positioned at either the retracted position or the extended position, the arm-side connection shaft and the main body-side connection shaft are aligned along a movement direction of the device main body.

14. The on-vehicle electronic device according to claim 13, wherein, when an arm center line that connects the axes of the support shaft and the arm-side connection shaft with each other is oriented in a direction perpendicular to the movement direction of the device main body, the axis of the arm-side connection shaft is moved to a position further away from the support shaft than the axis of the main body-side connection shaft.

15. The on-vehicle electronic device according to claim 11, wherein at least one of the guide units is a guide shaft, and the guide shaft is slidably received through a thrust bearing secured to the device main body.

16. The on-vehicle electronic device according to claim 15, wherein the first and second drive arms are respectively positioned on one side and the other side of a movement region of the device main body.

17. The on-vehicle electronic device according to claim 15, wherein the first drive arm and the second drive arm each have a sector gear integrally formed therewith, the sector gears of the first drive arm and the second drive arm are engaged with gears rotated by a single drive motor provided in the rotation driver.

18. The on-vehicle electronic device according to claim 15, wherein when the main body is in the retracted position, the device main body is retracted in an opening formed in a dash board of a vehicle, and when the main body is in the extended position, the main body projects from the opening.

* * * * *